US 6,676,484 B2

(12) United States Patent  (10) Patent No.: US 6,676,484 B2
Chopra  (45) Date of Patent: Jan. 13, 2004

(54) COPPER CHEMICAL-MECHANICAL POLISHING PROCESS USING A FIXED ABRASIVE POLISHING PAD AND A COPPER LAYER CHEMICAL-MECHANICAL POLISHING SOLUTION SPECIFICALLY ADAPTED FOR CHEMICAL-MECHANICAL POLISHING WITH A FIXED ABRASIVE PAD

(75) Inventor: Dinesh Chopra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 09/844,985

(22) Filed: Apr. 27, 2001

(65) Prior Publication Data

US 2001/0016469 A1 Aug. 23, 2001

Related U.S. Application Data

(63) Continuation of application No. 09/189,896, filed on Nov. 10, 1998, now Pat. No. 6,276,996.

(51) Int. Cl.⁷ .................................................. B24B 1/00
(52) U.S. Cl. ............................. 451/7; 451/28; 451/36; 451/288; 451/41; 438/691; 51/308
(58) Field of Search .................................. 451/7, 53, 41; 438/690–693, 959; 252/79.2; 216/88–89, 92; 51/308

(56) References Cited

U.S. PATENT DOCUMENTS

| 4,295,923 A | 10/1981 | Kasper |
| 4,311,551 A | * 1/1982 | Sykes ......................... 216/92 |
| 4,879,258 A | 11/1989 | Fisher |
| 4,944,836 A | 7/1990 | Beyer et al. |
| 4,956,313 A | 9/1990 | Cote et al. |
| 4,992,135 A | 2/1991 | Doan |
| 5,020,283 A | 6/1991 | Tuttle |
| 5,209,816 A | 5/1993 | Yu et al. |
| 5,232,875 A | 8/1993 | Tuttle et al. |
| 5,262,354 A | 11/1993 | Cote et al. |

(List continued on next page.)

FOREIGN PATENT DOCUMENTS

| EP | 0 659 858 A2 | 6/1995 |
| EP | 0 747 939 A2 | 12/1996 |

(List continued on next page.)

OTHER PUBLICATIONS

Luo, Q., et al., "Chemical–mechanical polishing of copper in alkaline media," *Thin Solid Films*, vol. 311, (1997) pp. 177–182.

*Primary Examiner*—George Nguyen
(74) *Attorney, Agent, or Firm*—Wells St. John P.S.

(57) ABSTRACT

The invention comprises copper chemical-mechanical polishing processes using fixed abrasive polishing pads, and copper layer chemical-mechanical polishing solutions specifically adapted for chemical-mechanical polishing with fixed abrasive pads. In one implementation, processes are described for pH's of 7.0 or greater. In one implementation, processes are described for pH's of 7.0 or less. In one implementation, a copper layer chemical-mechanical polishing solution specifically adapted for chemical-mechanical polishing with a fixed abrasive pad comprises a copper oxidizing component present at from about 1% to 15% by volume, a copper corrosion inhibitor present at from about 0.01% to 2% by weight, and a pH of less than or equal to 7.0. In one implementation, a copper layer chemical-mechanical polishing solution specifically adapted for chemical-mechanical polishing with a fixed abrasive pad comprises a copper oxidizing component present at from about 0.1% to 15% by volume, a copper complexing agent present at from about 0.1% to 15% by volume, and a pH of greater than or equal to 7.0.

48 Claims, 1 Drawing Sheet

U.S. PATENT DOCUMENTS

| | | | |
|---|---|---|---|
| 5,297,364 A | 3/1994 | Tuttle | |
| 5,340,370 A | 8/1994 | Cadien et al. | |
| 5,391,258 A | 2/1995 | Brancaleoni et al. | |
| 5,453,312 A | 9/1995 | Haas et al. | |
| 5,516,346 A | 5/1996 | Cadien et al. | |
| 5,575,885 A | 11/1996 | Hirabayashi et al. | |
| 5,578,362 A | 11/1996 | Reinhardt et al. | |
| 5,578,523 A | 11/1996 | Fiordalice et al. | |
| 5,622,525 A | 4/1997 | Haisma et al. | |
| 5,624,303 A | 4/1997 | Robinson | |
| 5,643,050 A * | 7/1997 | Chen | 451/10 |
| 5,700,348 A | 12/1997 | Sakurai | |
| 5,700,389 A * | 12/1997 | Nakagawa | 252/79.2 |
| 5,725,417 A | 3/1998 | Robinson | |
| 5,733,176 A | 3/1998 | Robinson et al. | |
| 5,749,772 A * | 5/1998 | Shimokawa | 451/53 |
| 5,782,675 A | 7/1998 | Southwick | |
| 5,783,489 A | 7/1998 | Kaufman et al. | |
| 5,836,806 A | 11/1998 | Cadien et al. | |
| 5,840,629 A | 11/1998 | Carpio | |
| 5,897,375 A | 4/1999 | Watts et al. | |
| 5,954,975 A | 9/1999 | Cadien et al. | |
| 5,954,997 A | 9/1999 | Kaufman et al. | |
| 5,958,794 A | 9/1999 | Bruxvoort et al. | |
| 5,972,792 A | 10/1999 | Hudson | |
| 5,981,454 A | 11/1999 | Small | |
| 5,993,686 A | 11/1999 | Streinz et al. | |
| 6,007,408 A * | 12/1999 | Sandhu | 451/41 |
| 6,046,110 A | 4/2000 | Hirabayashi et al. | |
| 6,121,144 A * | 9/2000 | Marcyk et al. | 438/692 |
| 6,206,756 B1 | 3/2001 | Chopra et al. | |
| 6,276,996 B1 * | 8/2001 | Chopra | 451/41 |
| 6,379,222 B2 * | 4/2002 | Wise et al. | 451/41 |

FOREIGN PATENT DOCUMENTS

| | | | |
|---|---|---|---|
| EP | 0 708 160 A3 | 6/1997 | |
| EP | 0 811 666 A2 | 12/1997 | |
| EP | 0 747 939 A3 | 10/1998 | |
| EP | 0 811 666 A3 | 10/1998 | |
| EP | 0 846 742 A3 | 10/1998 | |
| EP | 0 846 742 A2 | 10/1998 | |
| EP | 0 896 042 A1 | 2/1999 | |
| EP | 0 913 442 A2 | 5/1999 | |
| JP | 10-275789 | 10/1991 | |
| JP | 3-256665 | 11/1991 | |
| JP | 7-193034 | 7/1995 | |
| JP | 8-302338 | 11/1996 | |
| JP | 8-510437 | 11/1996 | |
| JP | 10-4070 | 1/1998 | |
| JP | 10-67986 | 3/1998 | |
| JP | 10-287865 | 10/1998 | |
| WO | WO 96/16436 | 5/1996 | |
| WO | WO/98/49723 | * 11/1998 | 451/41 |
| WO | WO 98/49723 | 11/1998 | 451/41 |

* cited by examiner

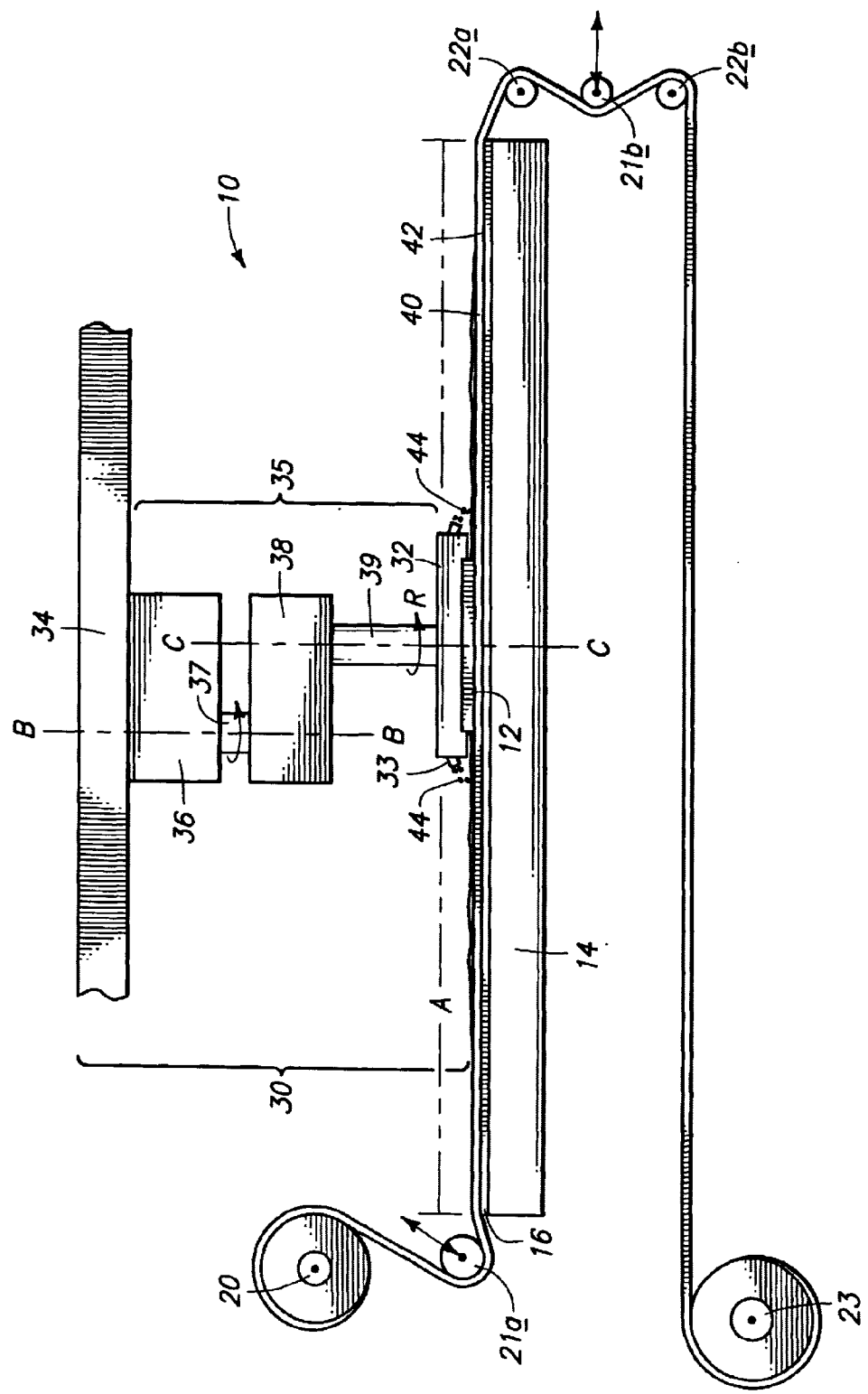

US 6,676,484 B2

COPPER CHEMICAL-MECHANICAL POLISHING PROCESS USING A FIXED ABRASIVE POLISHING PAD AND A COPPER LAYER CHEMICAL-MECHANICAL POLISHING SOLUTION SPECIFICALLY ADAPTED FOR CHEMICAL-MECHANICAL POLISHING WITH A FIXED ABRASIVE PAD

CROSS REFERENCE TO RELATED APPLICATION

This is a Continuation of U.S. patent application Ser. No. 09/189,896, filed Nov. 10, 1998, now U.S. Pat. No. 6,276,996, and titled "Copper Chemical-Mechanical Polishing Process Using a Fixed Abrasive Polishing Pad and a Copper Layer Chemical-Mechanical Polishing Solution Specifically Adapted for Chemical-Mechanical Polishing with a Fixed Abrasive Pad", the disclosure of which is incorporated by reference.

TECHNICAL FIELD

This invention relates to copper chemical-mechanical polishing processes using fixed abrasive polishing pads, and to copper layer chemical-mechanical polishing solutions specifically adapted for chemical-mechanical polishing with fixed abrasive pads.

BACKGROUND OF THE INVENTION

In the manufacture of integrated circuits from semiconductor wafers and substrates, wafer polishing is a common technique utilized to remove material and/or achieve planarity. Such polishing can be conducted by purely chemical, purely mechanical or chemical-mechanical polishing means (CMP). With CMP, polishing and removal occurs by a combination of both chemical and mechanical-polishing action. CMP utilizes a combination of solid abrasives and chemicals to achieve the combination polishing action. One type of chemical-mechanical polishing utilizes a slurry comprising very hard, solid abrasive particles suspended in a chemical solution. The slurry is interposed between a pad and a wafer, with both typically being caused to rotate, and material removed from the wafer by both chemical and mechanical action. Another form of CMP provides abrasive material embedded within the surface of the polishing pad, and is commonly referred to as fixed abrasive CMP.

Unfortunately, conventional CMP slurries designed for non-fixed abrasive CMP create problems and do not always work satisfactorily in fixed abrasive CMP processes. This has been discovered to be particularly true in the CMP of layers where copper is present at greater than or equal to fifty atomic percent. Increasing interest is being focused on copper as a next generation material for interconnect lines in semiconductor circuitry fabrication. CMP of copper in processes of forming such lines will play a significant and valuable role in the fabrication of such circuitry. While CMP of copper has been reported using non-fixed abrasive pads and slurries, existing materials have proven less than satisfactory when using fixed abrasive pads. Accordingly, needs remain for improved chemical-mechanical processes using fixed abrasive pads and in the development of polishing solutions therefor.

SUMMARY OF THE INVENTION

The invention comprises copper chemical-mechanical polishing processes using fixed abrasive polishing pads, and copper layer chemical-mechanical polishing solutions specifically adapted for chemical-mechanical polishing with fixed abrasive pads. In the context of this document unless otherwise specifically literally narrowed, a "copper layer" constitutes a layer having copper present at least at 50% molar. In one implementation, processes are described for pH's of 7.0 or greater. In one implementation, processes are described for pH's of 7.0 or less. Believed process mechanisms by which polishings occur in accordance with the invention are disclosed, but are not intended to be limiting unless expressly worded in the respective claim.

In one implementation, a copper layer chemical-mechanical polishing solution specifically adapted for chemical-mechanical polishing with a fixed abrasive pad comprises a copper oxidizing component present at from about 1% to 15% by volume, a copper corrosion inhibitor present at from about 0.01% to 2% by weight, and a pH of less than or equal to 7.0. In one implementation, a copper layer chemical-mechanical polishing solution specifically adapted for chemical-mechanical polishing with a fixed abrasive pad comprises a copper oxidizing component present at from about 0.1% to 15% by volume, a copper complexing agent present at from about 0.1% to 15% by volume, and a pH of greater than or equal to 7.0.

BRIEF DESCRIPTION OF THE DRAWINGS

FIG. 1 is a diagrammatic view of a prior art chemical-mechanical polishing apparatus used in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor wafer having an outer layer or region comprising copper at greater than or equal to 50% molar is polished with improved solutions using fixed abrasive pads. The invention was principally predicated upon the chemical-mechanical polishing of copper layers consisting essentially of elemental copper. However, the invention is anticipated to have applicability to polishing any copper layers having greater than or equal to 50% molar copper content, including such layers consisting essentially of copper alloys.

A wafer having such a layer is positioned within a suitable chemical-mechanical polishing apparatus comprising a fixed abrasive chemical-mechanical polishing pad. Any suitable apparatus is usable, such as by way of example only, those apparatus which rotate/revolve both a fixed abrasive pad and the wafer, those apparatus which rotate/move a fixed abrasive pad and not the wafer, those apparatus which rotate/revolve the wafer and not a fixed abrasive pad, etc. Fixed abrasive pads can be purchased from many suppliers, such as the 3M Company of St. Paul, Minn. A copper layer chemical-mechanical polishing solution in accordance with the invention is provided intermediate the pad and the wafer utilizing the polishing equipment. In one implantation, the solution comprises a copper oxidizing component present at from about 0.5% to 15% by volume, a copper corrosion inhibitor present at from about 0.01% to 2% by weight, and a solution pH of less than or equal to 7.0.

Example preferred oxidizing components include ammonium compounds and nitrate compounds. Specific examples include ferric nitrate, hydrogen peroxide, ammonium persulfate, ammonium molybdate, nitric acid, potassium iodate, potassium nitrate and mixtures thereof. Example preferred copper corrosion inhibitors include azoles such as benzotriazole, mercaptabenzothiazole and tolytriazole; amines such as methylamine and diethylamine; ring compounds such as pyridine, quinoline, and dicyclohexamine nitrite; other compounds such as potassium silicate, ammonium borate, ammonium phosphate and potassium dichromate; and mixtures thereof. A solution pH is more preferably kept at less than 5.0, with the solution also preferably comprising a pH buffer at, for example, 0.1% to 10% by weight. Example buffers include potassium hydrogen phthalate, ammonium phosphate, ammonium acetate, ammonium dihydrogen phosphate, dibasic ammonium citrate, ammonium hydrogen phosphate, tribasic ammonium citrate, ammonium oxalate, ammonium carbamate and mixtures thereof.

The solution can also comprise a surfactant, for example present at a concentration of from 1% to 10% by volume. Example surfactants include polyethylene glycol, polyoxyethylene ether, glycerol, polypropylene glycol, polyoxyethylene lauryl ether, polyoxyethylene cetyl ether, polyoxyethylene stearyl ether, polyoxyethylene oleyl ether, and mixtures thereof. The solution might further comprise thickeners to achieve desired viscosity, with an example preferred range being from about 10 centipoise to 20 centipoise at room temperature. Examples of thickeners include Polyox™ available from Union Carbide of Danbury, Conn. and Carbopol™ available from B. F. Goodrich of Cleveland, Ohio.

The solution is most ideally provided to be void of solid abrasive material, at least prior to starting chemical-mechanical polishing. Once polishing commences with the fixed abrasive pad, it is possible that some abrasive material from the pad will break off of the pad and find its way into solution, but ideally the solution is essentially abrasive-free in accordance with the most preferred aspects of the invention.

With such exemplary solutions in accordance with the invention received intermediate the wafer and pad, the copper comprising layer is chemical-mechanical polished with the fixed abrasive pad.

In another considered aspect of the invention, copper from the layer being polished is oxidized with a solution comprising a copper corrosion inhibitor present at from about 0.01% to 2% by weight, and having a pH of less than or equal to 7.0. One or both of copper and copper oxide from the copper comprising layer is polished with a fixed abrasive chemical-mechanical polishing pad. The oxidized copper might oxidize on the layer prior to removal, or be polished/etched away from the layer as copper and be oxidized and dissolved in solution thereafter. Both of these actions might also occur, with one or the other possibly predominating. Solution components during polishing preferably constitute those as described above, and again in significant consideration is ideally void of solid abrasive material. Polishing preferably is conducted at atmospheric pressure and anywhere from 40° F. up to 145° F., although other conditions are of course possible.

In an alternate aspect of the invention, a chemical-mechanical polishing process and solution therefor comprises a copper oxidizing component present at from 0.1% to 15% by volume, a copper complexing agent present at from about 0.1% to 15% by volume, and a pH of greater than or equal to 7.0. Some exemplary copper oxidizing components in accordance with this aspect include those as described above. A preferred complexing agent comprises ammonia. Such can be, for example, derived from a material in the solution selected from the group consisting of ammonium hydroxide, diammonium hydrogen phosphate, ammonium dihydrogen phosphate, ammonium acetate, tribasic ammonium citrate, dibasic ammonium citrate, ammonium oxalate, ammonium carbamate and mixtures thereof. The solution most preferably comprises a pH of less than or equal to 10.0, and also includes a pH buffer which in some cases can be the same as the complexing agent. For example, each of ammonium hydroxide, diammonium hydrogen phosphate, ammonium dihydrogen phosphate, ammonium acetate, tribasic ammonium citrate, dibasic ammonium citrate, ammonium oxalate and ammonium carbamate can also provide a pH buffering function. Surfactants, thickeners and copper corrosion inhibitors can and are preferably utilized where appropriate, as described above.

In another considered aspect of the invention, copper is polished from a layer comprising copper at greater than or equal to 50% molar using a fixed abrasive chemical-mechanical polishing pad. During the polishing, at least one of $Cu^{++}$ and $Cu^+$ from the copper layer is provided into a solution comprising ammonia and a pH greater than or equal to 7.0. The $Cu^{++}$ and/or $Cu^+$ is complexed with the ammonia in that solution. More specifically, during polishing oxidizers help in conversion of Cu to $Cu^+/Cu^{++}$ either by oxidizing copper on the layer surface and/or by converting Cu to $Cu^+/Cu^{++}$ once copper is abraded and is in the solution. Once copper ions are in the solution, ammonium based compounds in the solution complex the ions. Again most preferably, the solution is void of solid abrasive material, at least prior to starting said polishing.

Example slurry abrasives of the prior art in the chemical mechanical polishing of copper include $SiO_2$, $CeO_2$ and $Al_2O_3$. In certain desired polishing actions, one might be more favored than another. Further, different pH ranges using the different abrasives might be desired for each abrasives. Yet in prior art chemical-mechanical polishing solutions and process, it has been found that the abrasives do not remain well dispersed throughout the solution at certain desired pH's. For example, $SiO_2$ will not stay well dispersed in solution if pH falls below 4. $CeO_2$ will not stay well dispersed in solution at a neutral pH around 7. $Al_2O_3$ will not stay well dispersed in solution if pH rises too high. This has typically resulted in using a less desirable abrasive for a given application where a specific pH is desired. Yet fixed abrasive polishing using solutions of the invention in combination with using a fixed abrasive pad can enable utilization of desired abrasives across a wider pH range.

Further in many instances, it would be desirable to maintain temperature at or below room temperature during the copper polish (i.e., at or below 74° F.). This is seldom practical where lower slurry temperature will also result in poor abrasive material dispersal throughout the slurry during polish. Accordingly, elevated temperatures are utilized during the polish. Yet in accordance with an aspect of the invention, slurry temperature during polish can be maintained at or below room temperature (further preferably at or below 65° F.) where the abrasive is fixed on the pad and agglomeration of abrasives within the slurry is not a concern. Polishing in all embodiments preferably is conducted at atmospheric pressure and anywhere from 40° F. up to 145° F., although other conditions are of course possible.

Example equipment and processing utilized in accordance with the invention is described with reference to FIG. 1, wherein a web-format planarizing machine 10 is used for chemical-mechanical polishing a semiconductor wafer 12. Planarizing machine 10 has a support table 14 with a top panel 16 at a work station where an operative portion (A) of a planarizing pad 40 is positioned. The top-half panel 16 is generally a rigid plate to provide a flat, solid surface to which a particular section of planarizing pad 40 may be secured during polishing.

Planarizing machine 10 also has a plurality of rollers to guide, position and hold planarizing pad 40 over top panel 16. The rollers include a supply roller 20, first and second idler rollers 21a and 21b, first and second guide rollers 22a and 22b, and a take-up roller 23. The supply roller 20 carries an unused or pre-operative portion of the planarizing pad 40, and take-up roller carries a used or post-operative portion of planarizing pad 40. First idler roller 21a and first guide roller 22a stretch planarizing pad 40 over top panel 16 to hold the planarizing pad 40 stationary during operation. Planarizing pad 40 in accordance with the invention preferably comprises a fixed abrasive pad, such as described above, and having a length greater than a maximum diameter of the wafers being polished. A motor (not shown) drives at least one of supply roller 20 and take-up roller 23 to sequentially advance the planarizing pad 40 across the top-panel 16. As such, clean pre-operative sections of the planarizing pad 40 may be quickly substituted for used sections to provide a consistent surface for planarizing and/or cleaning the substrate.

The web-format planarizing machine 10 has a carrier assembly 30 that controls and protects wafer 12 during polishing. Carrier assembly 30 generally has a substrate holder 32 to pick up, hold and release wafer 12 at appropriate stages of the polishing cycle. A plurality of nozzles 33 attached to substrate holder 32 dispense a planarizing solution 44 in accordance with the invention onto a planarizing surface 42 of planarizing pad 40. Carrier assembly 30 also generally has a support gantry 34 carrying a drive assembly 35 that translates along gantry 34. Drive assembly 35 generally has an actuator 36, a drive shaft 37 coupled to the actuator 36, and an arm 38 projecting from drive shaft 37. Arm 38 carries substrate holder 32 via another shaft 39 such that drive assembly 35 orbits substrate holder 32 about an axis B—B offset from a center point C—C of wafer 12.

In accordance with an aspect of the invention, the process preferably comprises moving web/pad 40 a distance less than the maximum diameter of the wafer such that a subsequently polished wafer is exposed to a fresh pad segment which was not utilized to polish the immediately preceding wafer. Preferably, the distance moved is less than or equal to 1.0% of the maximum diameter for uniformity of polish and to extend life of the pad. For example for an 8-inch diameter wafer, an incremental movement of pad/web 40 between each polishing is 0.25 inch.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical-mechanical polishing process comprising:
   providing a semiconductor wafer having a layer comprising copper at least at 50% molar;
   positioning the wafer in proximity with a fixed abrasive chemical-mechanical polishing pad;
   providing a copper layer chemical-mechanical polishing solution intermediate the wafer and pad, the copper layer chemical-mechanical polishing solution comprising a copper oxidizing component present at from about 0.5% to 15% by volume, a copper corrosion inhibitor present at from about 0.01% to 2% by weight, and a pH of less than or equal to 7.0; and
   chemical-mechanical polishing the copper comprising layer with the fixed abrasive pad with the copper layer chemical-mechanical polishing solution being received between the wafer and pad, and maintaining temperature of the solution during polishing at or below about 74° F.

2. The process of claim 1 wherein the temperature of the solution during polishing is maintained at or below about 65° F.

3. The process of claim 1 wherein the layer comprising copper comprises copper equal to about 50% molar.

4. The process of claim 1 wherein the copper corrosion inhibitor is present at about 0.01% by weight.

5. The process of claim 1 wherein the pH is less than 7.0.

6. A chemical-mechanical polishing process comprising:
   providing a semiconductor wafer having a layer comprising copper at least at 50% molar;
   positioning the wafer in proximity with a fixed abrasive chemical-mechanical polishing pad;
   providing a copper layer chemical-mechanical polishing solution intermediate the wafer and pad, the copper layer chemical-mechanical polishing solution comprising a copper oxidizing component present at from about 0.5% to 15% by volume, a copper corrosion inhibitor present at from about 0.01% to 2% by weight, and a pH of less than or equal to 7.0;
   chemical-mechanical polishing the copper comprising layer with the fixed abrasive pad with the copper layer chemical-mechanical polishing solution being received between the wafer and pad, the solution during polishing being maintained at or below about 74° F.; and
   further comprising chemical-mechanical polishing another of said semiconductor wafer in another polishing step using the fixed abrasive pad, the fixed abrasive pad comprising an elongated web of fixed abrasive pad material having a length greater than a maximum diameter of the said wafers being polished, the process comprising moving the web a distance less than the maximum diameter to polish the another wafer with a fresh pad segment not utilized to polish the first polished wafer.

7. The process of claim 6 wherein the distance is less than or equal to 1.0% of the maximum diameter.

8. The process of claim 6 wherein the temperature of the solution during polishing is maintained at or below about 65° F.

9. The process of claim 6 wherein the layer comprising copper comprises copper equal to about 50% molar.

10. The process of claim 6 wherein the copper corrosion inhibitor is present at about 0.01% by weight.

11. The process of claim 6 wherein the pH is less than 7.0.

12. A chemical-mechanical polishing process comprising:
providing a semiconductor wafer having a layer comprising copper at least at 50% molar;
   oxidizing copper from the layer with a solution comprising a copper corrosion inhibitor present at from about 0.01% to 2% by weight and a pH of less than or equal to 7.0;
   polishing one or both of copper and copper oxide from the copper comprising layer with a fixed abrasive chemical-mechanical polishing pad, and maintaining temperature of the solution during polishing at or below about 74° F.

13. The process of claim 12 wherein the temperature of the solution during polishing is maintained at or below about 65° F.

14. The process of claim 12 wherein the layer comprising copper comprises copper equal to about 50% molar.

15. The process of claim 12 wherein the copper corrosion inhibitor is present at about 0.01% by weight.

16. The process of claim 12 wherein the pH is less than 7.0.

17. A chemical-mechanical polishing process comprising:
providing a semiconductor wafer having a layer comprising copper at least at 50% molar;
oxidizing copper from the layer with a solution comprising a copper corrosion inhibitor present at from about 0.01% to 2% by weight and a pH of less than or equal to 7.0;
polishing one or both of copper and copper oxide from the copper comprising layer with a fixed abrasive chemical-mechanical polishing pad and the solution, the solution during polishing being maintained at or below about 74° F.; and
further comprising chemical-mechanical polishing another of said semiconductor wafer in another polishing step using the fixed abrasive pad, the fixed abrasive pad comprising an elongated web of fixed abrasive pad material having a length greater than a maximum diameter of the said wafers being polished, the process comprising moving the web a distance less than the maximum diameter to polish the another wafer with a fresh pad segment not utilized to polish the first polished wafer.

18. The process of claim 17 wherein the distance is less than or equal to 1.0% of the maximum diameter.

19. The process of claim 17 wherein the temperature of the solution during polishing is maintained at or below about 65° F.

20. The process of claim 17 wherein the layer comprising copper comprises copper equal to about 50% molar.

21. The process of claim 17 wherein the copper corrosion inhibitor is present at about 0.01% by weight.

22. The process of claim 17 wherein the pH is less than 7.0.

23. A chemical-mechanical polishing process comprising:
providing a semiconductor wafer having a layer comprising copper at least at 50% molar;
positioning the wafer in proximity with a fixed abrasive chemical-mechanical polishing pad;
providing a copper layer chemical-mechanical polishing solution intermediate the wafer and pad, the copper layer chemical-mechanical polishing solution comprising a copper oxidizing component present at from about 0.1% to 15% by volume, a copper complexing agent present at from about 0.1% to 15% by volume, and a pH of greater than or equal to 7.0;
chemical-mechanical polishing the copper comprising layer with the fixed abrasive pad with the copper layer chemical-mechanical polishing solution being received between the wafer and pad; and maintaining temperature of the solution during polishing at or below about 74° F.

24. The process of claim 23 wherein the temperature of the solution during polishing is maintained at or below about 65° F.

25. The process of claim 23 wherein the layer comprising copper comprises copper equal to about 50% molar.

26. A chemical-mechanical polishing process comprising:
providing a semiconductor wafer having a layer comprising copper at least at 50% molar;
positioning the wafer in proximity with a fixed abrasive chemical-mechanical polishing pad;
providing a copper layer chemical-mechanical polishing solution intermediate the wafer and pad, the copper layer chemical-mechanical polishing solution comprising a copper oxidizing component present at from about 0.1% to 15% by volume, a copper complexing agent present at from about 0.1% to 15% by volume, and a pH of greater than or equal to 7.0;
chemical-mechanical polishing the copper comprising layer with the fixed abrasive pad with the copper layer chemical-mechanical polishing solution being received between the wafer and pad, the solution during polishing being maintained at or below about 74° F.; and
further comprising chemical-mechanical polishing another of said semiconductor wafer in another polishing step using the fixed abrasive pad, the fixed abrasive pad comprising an elongated web of fixed abrasive pad material having a length greater than a maximum diameter of the said wafers being polished, the process comprising moving the web a distance less than the maximum diameter to polish the another wafer with a fresh pad segment not utilized to polish the first polished wafer.

27. The process of claim 26 wherein the distance is less than or equal to 1.0% of the maximum diameter.

28. The process of claim 26 wherein the temperature of the solution during polishing is maintained at or below about 65° F.

29. The process of claim 26 wherein the layer comprising copper comprises copper equal to about 50% molar.

30. A chemical-mechanical polishing process comprising:
providing a semiconductor wafer having a layer comprising copper at least at 50% molar;
polishing copper from the copper comprising layer with a fixed abrasive chemical-mechanical polishing pad and a polishing solution, the polishing solution being maintained at or below about 74° F. during polishing; and
during the polishing, providing at least $Cu^+$ from the copper layer into the polishing solution, wherein the polishing solution comprises ammonia and has a pH greater than or equal to 7.0, and wherein the $Cu^+$ complexes with the ammonia in the polishing solution.

31. The polishing process of claim 30 wherein the solution comprises both $Cu^{3o+}$ and $Cu^+$.

32. The polishing process of claim 30 wherein the solution comprises a pH greater than or equal to 7.0 and of less than or equal to 10.0.

33. The polishing process of claim 30 wherein the solution comprises a pH buffer.

34. The polishing process of claim 30 wherein the temperature of the solution during polishing is maintained at or below about 65° F.

35. The polishing process of claim 30 wherein the pH buffer is selected from the group consisting of ammonium acetate, ammonium oxalate, potassium hydrogen phthalate, ammonium carbamate and mixtures thereof.

36. The polishing process of claim 30 wherein the solution comprises a pH of less than or equal to 10.0, and comprises a pH buffer.

37. The polishing process of claim 30 wherein the solution comprises a surfactant present at a concentration of from 1% to 10% by volume.

38. The polishing process of claim 30 wherein the solution comprises a surfactant selected from the group consisting of polyoxyethylene ether, glycerol, polypropylene glycol, polyoxyethylene lauryl ether, polyoxyethylene cetyl ether, polyoxyethylene stearyl ether, polyoxyethylene oleyl ether, and mixtures thereof.

39. The polishing process of claim 30 wherein the solution further comprises a thickener and has a viscosity of from about 10 centipoise to 20 centipoise at room temperature.

40. The polishing process of claim 30 wherein the layer consists essentially of elemental copper.

41. The polishing process of claim 30 wherein the layer consists essentially of a copper alloy.

42. The polishing process of claim 30 wherein the polishing is conducted with a solution which is void of solid abrasive material at least prior to starting said polishing.

43. The polishing process of claim 30 wherein the solution further comprises a copper corrosion inhibitor.

44. The polishing process of claim 43 wherein the inhibitor is selected from the group consisting of quinoline, dicyclohexamine nitrate, potassium silicate, ammonium borate, ammonium phosphate, potassium dichromate and mixtures thereof.

45. The polishing process of claim 30 comprising maintaining temperature of the solution during polishing at or below about 65° F.

46. The polishing process of claim 30 further comprising chemical-mechanical polishing another of said semiconductor wafer in another polishing step using the fixed abrasive pad, the fixed abrasive pad comprising an elongated web of fixed abrasive pad material having a length greater than a maximum diameter of the said wafers being polished, the process comprising moving the web a distance less than the maximum diameter to polish the another wafer with a fresh pad segment not utilized to polish the first polished wafer.

47. The polishing process of claim 46 wherein the distance is less than or equal to 1.0% of the maximum diameter.

48. The process of claim wherein 30 the layer comprising copper comprises copper equal to about 50% molar.

* * * * *

UNITED STATES PATENT AND TRADEMARK OFFICE
CERTIFICATE OF CORRECTION

PATENT NO.    : 6,676,484 B2
DATED         : January 13, 2004
INVENTOR(S)   : Dinesh Chopra It is certified that error appears in the above-identified patent and that said Letters Patent is hereby corrected as shown below:

Column 8,
Line 48, replace "comprises $Cu^{30+}$ and $Cu^+$." with -- comprises $Cu^{++}$ and $Cu^+$. --

Column 10,
Line 18, replace "The process of claim wherein 30 the layer comprising" with -- The process of claim 30 wherein the layer comprising --

Signed and Sealed this

Thirteenth Day of July, 2004

JON W. DUDAS
*Acting Director of the United States Patent and Trademark Office*